US008677853B2

(12) United States Patent
Shimamoto et al.

(10) Patent No.: US 8,677,853 B2
(45) Date of Patent: Mar. 25, 2014

(54) ROBOT ARM WITH TEMPERATURE COMPENSATION

(75) Inventors: Mitsuru Shimamoto, Tsu (JP); Takahiro Maekawa, Tsu (JP)

(73) Assignee: Nabtesco Corporation, Tokyo (JP)

( * ) Notice: Subject to any disclaimer, the term of this patent is extended or adjusted under 35 U.S.C. 154(b) by 1197 days.

(21) Appl. No.: 12/450,802

(22) PCT Filed: Apr. 21, 2008

(86) PCT No.: PCT/JP2008/057672
§ 371 (c)(1),
(2), (4) Date: Oct. 14, 2009

(87) PCT Pub. No.: WO2008/136292
PCT Pub. Date: Nov. 13, 2008

(65) Prior Publication Data
US 2010/0116077 A1    May 13, 2010

(30) Foreign Application Priority Data

Apr. 27, 2007  (JP) ................................. 2007-119695

(51) Int. Cl.
*B25J 13/00*    (2006.01)
(52) U.S. Cl.
USPC ........................................ 74/490.01; 901/15
(58) Field of Classification Search
USPC ............... 74/490.01, 490.03, 490.05, 490.06, 74/501.5 R; 901/15; 294/902
See application file for complete search history.

(56) References Cited

U.S. PATENT DOCUMENTS

| 6,292,716 | B1 * | 9/2001 | Moore et al. .................. 700/260 |
| 6,558,107 | B1 | 5/2003 | Okuno |
| 2002/0048502 | A1 | 4/2002 | Minami et al. |
| 2003/0012631 | A1 | 1/2003 | Pencis et al. |
| 2003/0014155 | A1 | 1/2003 | Pencis et al. |
| 2003/0014157 | A1 | 1/2003 | Freeman et al. |
| 2005/0095112 | A1 | 5/2005 | Minami et al. |
| 2006/0120849 | A1 * | 6/2006 | Mori et al. .................. 414/744.5 |

FOREIGN PATENT DOCUMENTS

| JP | A-64-64232 | 3/1989 |
| JP | A-1-305533 | 12/1989 |
| JP | A-11-216691 | 8/1999 |
| JP | A-2000-208588 | 7/2000 |
| JP | A-2002-307341 | 10/2002 |
| JP | A-2004-134747 | 4/2004 |
| JP | A-2006-123135 | 5/2006 |

* cited by examiner

*Primary Examiner* — Justin Krause
*Assistant Examiner* — Gregory Prather
(74) *Attorney, Agent, or Firm* — Oliff PLC

(57) ABSTRACT

In a robot arm is provided with a closed link mechanism between a base and a hand, and a temperature of a first link member from among a plurality of link members constituting the closed link mechanism is to reach a first temperature T1, and a temperature of a second link member is to reach a second temperature T2, the first link member and the second link member formed from differing materials. An elongation ratio of the first link member, in which a length of the first link member at the first temperature T1 is divided by length of the first link member at a pre-operation temperature T0 is approximately equal to an elongation ratio of the second link member, in which a length of the second link member at the second temperature T2 is divided by a length of the second link member at the pre-operation temperature T0.

14 Claims, 7 Drawing Sheets

ROBOT ARM WITH TEMPERATURE COMPENSATION

TECHNICAL FIELD

The present application claims priority to Japanese Patent Application No. 2007-119695 filed on Apr. 27, 2007, the contents of which are hereby incorporated by reference into the present specification.

The present invention relates to a robot arm. In particular, the present invention relates to a robot arm that comprises a closed link mechanism between a base and a hand, and can be used in holding and moving high temperature work.

BACKGROUND ART

A closed link mechanism between a base and a hand may be adopted in a robot arm utilized in an environment where dust must be shut out, such as a clean room or the like. The closed link mechanism uses a motor attached to a base to control the relative angle of two links connected to the base, and can control the position of the hand at a distal end of an arm by changing the shape of a polygon formed by the closed link. This closed link mechanism is suitable for use in the clean room because the motor, which likely gives off dust, does not need to be located at each joint of the robot arm in which the closed link mechanism is comprised. A robot arm in which a closed link mechanism has been adopted is disclosed in Japanese Patent Application Publication No. 2000-208588.

DISCLOSURE OF INVENTION

Problem to be Solved by the Invention

High temperature work may need to be moved when utilizing this conventional robot arm. For example, during a semiconductor manufacturing process, a semiconductor wafer may need to be moved at a high temperature in a vacuum. When the high temperature semiconductor wafer is held in the hand, the heat of the high temperature semiconductor wafer is transmitted to the links that constitute the robot arm, and the temperature of the links rises. When the temperature of the links rises, thermal expansion of the links occurs, and the length of the links changes. When the length of the link changes, the position of the hand also changes.

In particular, in the case of the robot arm comprising the closed link mechanism, as described above, the position of the hand is determined by controlling the relative angle of the two links connected to the base. As a result, the change in the length of the links from the base to the hand will significantly affect the position of the hand. This is because, even if the relative angle of the two links connected to the base is controlled accurately, the position of the hand will become misaligned by the change in the length of the links from the base to the hand.

In the present invention, a technique set forth is capable of controlling misalignment of the hand in the robot arm comprising the closed link mechanism between the base and the hand when this robot arm is utilized to move high temperature work.

Means to Solve the Problem

According to the research of the present inventors, in the case of the robot arm comprising the closed link mechanism, it has been found that when the shape of the polygon formed by the closed link changes from an initial state (a state prior to the link having a high temperature) to a thermally expanded state, the position of the hand is greatly affected thereby. When the shape of the polygon formed by the closed link is changed as above, the angle of any of the links between the base and the hand may become misaligned from the initial state. As a result, the actual position of the hand may be greatly misaligned from the programmed position thereof.

In the closed link mechanism, the shape of the polygon formed by the closed link changes in a retracted position (a state in which the arm is contracted) and an extended position (a state in which the arm is extended). For this reason, the misalignment in the polygon shape from the initial state to after the thermal expansion has a differing effect on the position of the hand depending on whether the arm is in the retracted position or the extended position. As a result, a direction and a magnitude of the misalignment (a vector of misalignment) of the hand in the retracted position differ to the vector of misalignment of the hand in the extended position. As described above, in the closed link mechanism, the position of the hand is determined by controlling the relative angle of the two links connected to the base. That is, in the closed link mechanism, only the relative angle of the two links connected to the base is controlled, and the relative angle between the links other than the two links connected to the base is not actively controlled. For this reason, if a difference between the vectors of misalignment in the retracted position and the extended position was large, even if the vector of misalignment in one position were to be offset by means of programming, the vector of misalignment in the other position cannot be reduced. For this reason, it has been found that when the robot arm comprising the closed link mechanism is utilized to move high temperature work, controlling misalignment of the hand is quite difficult.

The present teachings allow the length of the links to change due to thermal expansion. Although the length of the links is allowed to change, the material of the links is selected such that the polygon formed by the closed link maintains a similar (proportionate, homothetic) shape prior to thermal expansion and after thermal expansion. If the polygon formed by the closed link maintains the similar shape prior to thermal expansion and after thermal expansion, the misalignment of the hand in the retracted position and the extended position can remain merely as a proportionate change in the size of the polygon. That is, by preventing a change in each angle in the polygon formed by the closed link mechanism, occurrence of a large difference between the misalignment of the hand in the retracted position and the misalignment of the hand in the extended position can be prevented. Accordingly by reducing a discrepancy between the vectors of misalignment of the hand in both positions, the misalignment can be prevented in both the retracted position and the extended position.

In the robot arm of the present teachings, a first predetermined link and a second predetermined link from among a plurality of links comprising the closed link are made of differing materials. The first predetermined link is a link that reaches a first temperature $T1$ during operation, and the second predetermined link is a link that reaches a second temperature $T2$ during operation. Since the temperature of the links when the robot arm is utilized can be specified in advance, the first temperature $T1$ and the second temperature $T2$ can be specified in advance accordingly.

In the present teachings, an elongation ratio of the first predetermined link in a thermal expansion during a temperature change from a pre-operation temperature $T0$ to the first temperature $T1$ is equal to an elongation ratio of the second predetermined link in a thermal expansion during a temperature change from the pre-operation temperature T0 to the second temperature T2. In other words, the materials of the first predetermined link and the second predetermined link of the robot arm are selected such that the elongation ratio of the first predetermined link in the thermal expansion during the temperature change from the pre-operation temperature T0 to the first temperature T1 is equal to the elongation ratio of the second predetermined link in the thermal expansion during the temperature change from the pre-operation temperature T0 to the second temperature T2.

The term "be equal to the elongation ratio" in the present description does not mean that the elongation ratio of the first predetermined link in the thermal expansion is totally identical to the elongation ratio of the second predetermined link in the thermal expansion. As described above, an intention of the present teachings that the materials of the links are selected such that the polygon formed by the closed link maintains the homothetic shape in both before and after the thermal expansion. That is, this term "be equal to the elongation ratio" also means that the polygon formed by the closed link has an approximately equal elongation ratio such that the homothetic shape within a permissible range is maintained. Moreover, this similar shape within the permissible range means that, when the hand expands or contracts to move work, the similar shape is maintained within an error range in which the hand can move the work with the same degree of accuracy when the closed link mechanism maintains an entirely similar shape in thermal expansion.

According to the robot arm, when the high temperature work is moved while being held in the hand, the plurality of links that configures the closed link mechanism expands with approximately the same elongation ratio. Even if the length of the links changes due to thermal expansion, the polygon formed by the closed link is capable of maintaining the proportionate shape as the polygon prior to the thermal expansion of the links. As described above, misalignment of the hand caused by thermal expansion of the links can be reduced in both the retracted position and the extended position.

An aspect of a robot arm of the present teachings may be realized in a robot arm comprising a first motor and a second motor attached to the base, a first upper arm link having one end connected to an output shaft of the first motor, a second upper arm link having one end connected to an output shaft of the second motor, a first lower arm link having one end connected to another end of the first upper arm link, a second lower arm link having one end connected to another end of the second upper arm link, and a parallel link connecting another end of the first lower arm link and another end of the second lower arm link and keeping the first lower arm link and the second lower arm link parallel. In this robot arm, the closed link mechanism is configured by the first upper arm link, the first lower arm link, the parallel link, the second lower arm link, and the second upper arm link. A hand is connected to each of the first lower arm link and the second lower arm link.

The first upper arm link and the output shaft of the first motor may be connected via a reduction gear, and the second upper arm link and the output shaft of the second motor may also be connected via a reduction gear.

Since the robot arm may have two hands, one robot arm is capable of moving two items of work. Since the two lower arm links connected to respective hand are kept parallel, the position of one hand can be controlled accurately if the position of another hand is controlled accurately.

In the aforesaid robot arm, during operation, if the temperature of any of the links configuring the closed link mechanism reaches the first temperature T1 and the temperature of any of the other links configuring the closed link mechanism reaches the second temperature T2, the parallel state of the first lower arm link and the second lower arm link can be maintained. As a result, it is possible to reduce misalignment of the two hands caused by thermal expansion of the links.

It may be that the first predetermined link is configured by the first upper arm link and the second upper arm link, and that the second predetermined link is configured by the parallel link.

As described above, the first upper arm link and the second upper arm link are each connected to the output shaft of the corresponding motor. Since the motors are disposed at an atmosphere side and can radiate heat readily, the temperature of the upper arm links connected to the output shafts of the motors does not increase so much. On the other hand, since the parallel link is connected to the first upper arm link and the second upper arm link via the first lower arm link or the second lower arm link, the temperature thereof increases more severely than in the case of the upper arm links. That is, a temperature difference between the upper arm links and the parallel link can become large. By using different materials for the links which undergo a larger temperature difference, the misalignment of the hand can be reduced efficiently.

Effects of the Invention

According to the robot an arm of the present teachings, it is possible to reduce the difference in misalignment of the hand in the retracted position and misalignment of the hand in the extended position even if a temperature difference between the links occurs during operation. High temperature work can consequently be moved accurately.

BRIEF DESCRIPTION OF THE DRAWINGS

FIG. 5 shows a state in which a hand of a robot arm of a second embodiment is in the retracted position in.

PREFERRED EMBODIMENTS FOR CARRYING OUT THE INVENTION

Figure 1:
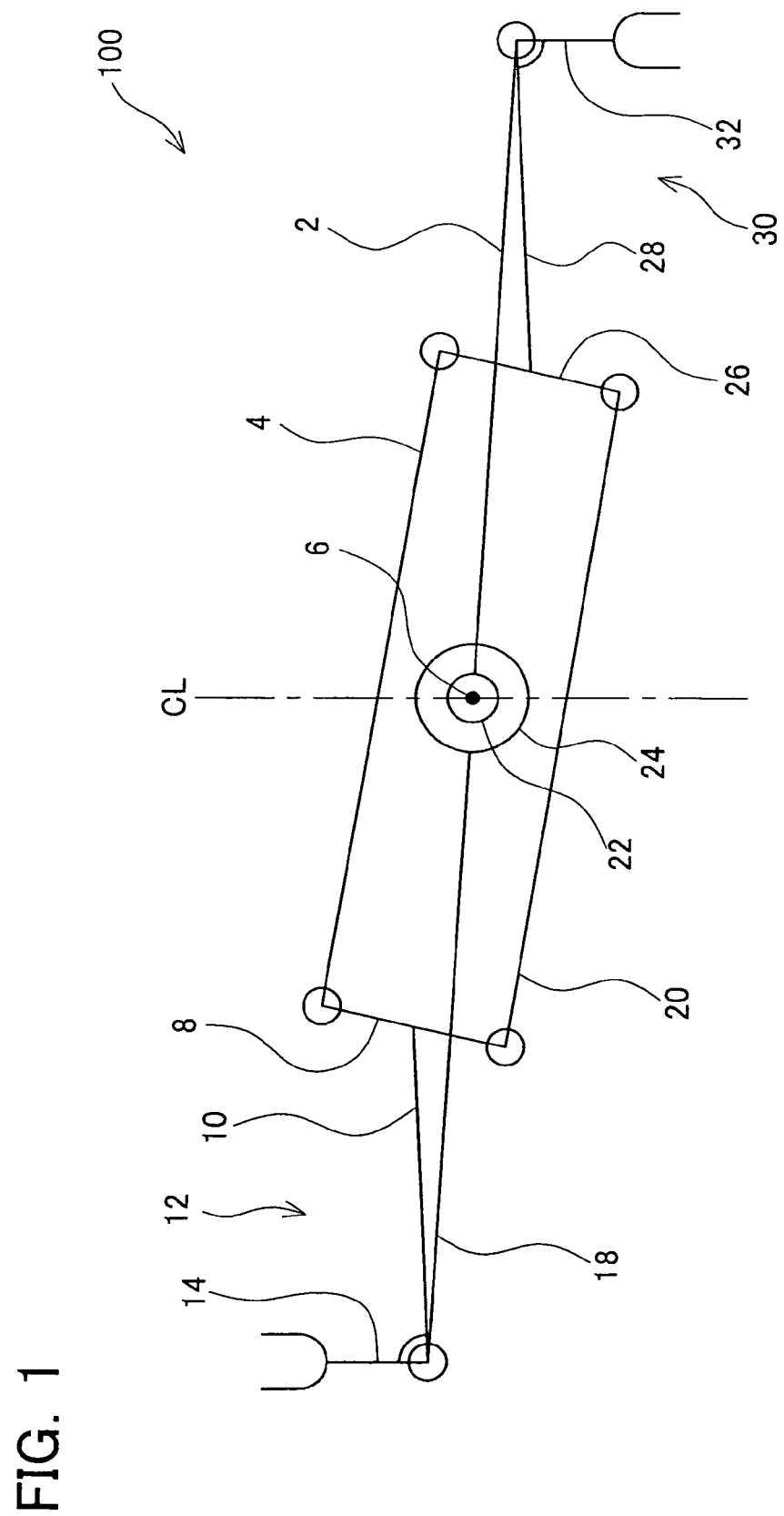
FIG. 1 shows a state in which a hand of a robot arm of a first embodiment is in a retracted position.

Some of features in the present embodiments will be described below.

(First feature) An output shaft of a first motor and an output shaft of a second motor, or a rotation shaft of a first arm and a rotation shaft of a second arm are disposed coaxially.

(Second feature) A robot arm 200 is disposed in a retracted position so as to overlap its components in the following sequence: hands 214 and 232, parallel links 204 and 220, and a first upper arm link 218 and a second upper arm link 202.

(First Embodiment)

A first embodiment will be described with reference to the figures. A robot arm 100 of the first embodiment comprises two arms, each of the arms configured by an upper arm link and a lower arm link. Hands are connected to the lower arm links respectively. Each of distal ends of the lower arm links of the arms is connected by a parallel link. A closed link mechanism is formed from the two arms and the parallel link. That is, although the robot arm 100 of the present embodiment comprises two arms each composed of the upper arm link, the lower arm link, and the hand, the aforesaid two arms and the parallel link form altogether the closed link mechanism, and consequently this robot arm has a closed link mechanism formed from its base to the hands.

Figure 2:
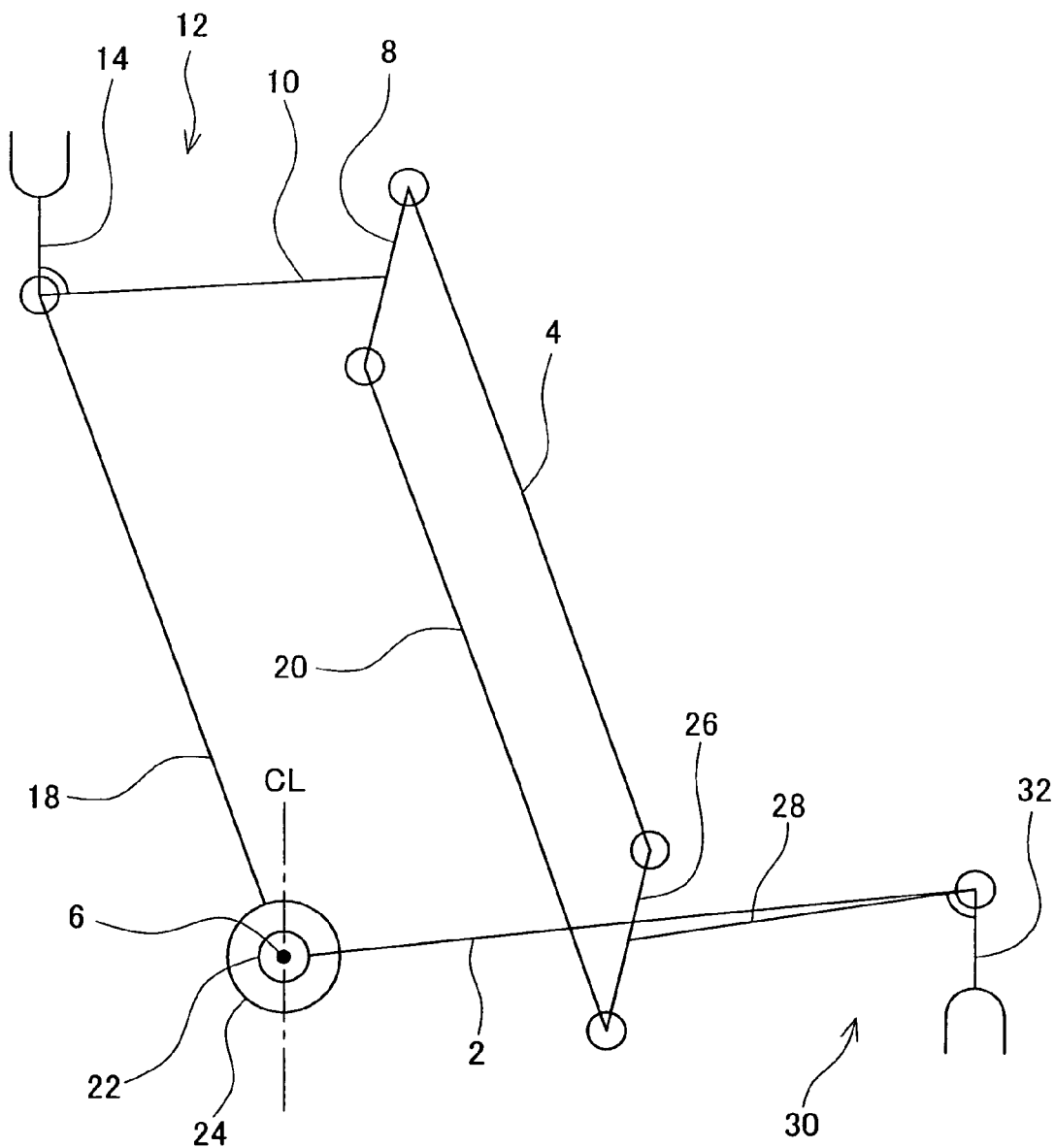
FIG. 2 shows a state in which the hand of the robot arm of the first embodiment is in an extended position.

FIG. 1 and FIG. 2 show a schematic view of the robot arm 100. FIG. 1 shows a first arm 12 and a second arm 30 in a contracted state (a retracted position). FIG. 2 shows the first arm 12 in an extended state (an extended position).

As shown in FIG. 1, the robot arm 100 comprises the first arm 12 connected to an output shaft 24 of a first motor (not shown), and the second arm 30 connected to an output shaft 22 of a second motor (not shown). The first motor and the second motor are attached to a base (not shown) of the robot arm 100, and the output shaft 24 of the first motor and the output shaft 22 of the second motor are disposed coaxially along an axis line 6.

The first arm 12 comprises a first upper arm link 18 having one (proximal) end connected to the output shaft 24 of the first motor, and a first lower arm link 10 having one (proximal) end connected to another (distal) end of the first upper arm link 18. The first lower arm link 10 is connected pivotally to the first upper arm link 18. A hand 14 is fixed to the aforesaid one end of the first lower arm link 10, and an extension member 8 is fixed to another (distal) end of the first lower arm link 10.

The second arm 30 comprises a second upper arm link 2 having one (proximal) end connected to the output shaft 22 of the second motor, and a second lower arm link 28 having one (proximal) end connected to another (distal) end of the second upper arm link 2. The second lower arm link 28 is connected pivotally to the second upper arm link 2. A hand 32 is fixed to the aforesaid one end of the second lower arm link 28, and an extension member 26 is fixed to another (distal) end of the second lower arm link 28.

Parallel links 4 and 20 are disposed between the first arm 12 and the second arm 30. The parallel links 4 and 20 are connected to the extension member 8 and the extension member 26 respectively. The parallel links 4 and 20 connect the distal end of the first lower arm link 10 and the distal end of the second lower arm link 28. Both ends of the parallel links 4 and 20 are connected pivotally to the extension members 8 and 26 respectively. Further, the parallel links 4 and 20 have equal length. The extension member 8 and the extension member 26 are kept parallel by the parallel links 4 and 20. That is, the first lower arm link 10 and the second lower arm link 28, and the hands 14 and 32 are kept parallel by the parallel links 4 and 20. Further, the hands 14 and 32 are disposed parallel to a center line CL.

The closed link mechanism is formed by the first upper arm link 18, the first lower arm link 10, the parallel link 4, the parallel link 20, the second lower arm link 28, and the second upper arm link 2.

Moreover, the links rotate within a flat surface plane of FIGS. 1 and 2. That is, in the robot arm 100, the closed link mechanism formed by the links is capable of changing, within the flat surface plane, the polygonal shape formed by the closed link mechanism. The robot arm 100 can change the position of the hands 14 and 32 within the flat surface plane by changing the polygonal shape of the closed link mechanism. In other words, the robot arm 100 is a type of scalar robot arm whose hands are moved within the flat surface plane by the closed link mechanism.

The two parallel links 4 and 20 can be considered virtually as one link connecting the first lower arm link 10 and the second lower arm link 28. When the parallel links 4 and 20 are considered virtually as one link, the closed link mechanism of the robot arm 100 is in a pentagonal shape. From among the links forming this pentagon, the first lower arm link 10 and the second lower arm link 28 are kept parallel, and consequently the shape of the pentagon is determined uniquely by determining the relative angles formed by the first upper arm link 18 and the second upper arm link 2. That is, in the robot arm 100, the positions of the hands 14 and 32 can be controlled by using the motors attached to the base to control the relative angles formed by the first upper arm link 18 and the second upper arm link 2.

For example, when the hand 14 is moved from the retracted position (see FIG. 1) to the extended position (see FIG. 2), the hand 14 is moved from the retracted position to the extended position by rotating the first output shaft 24 and the second output shaft 22 in differing directions and by differing amounts of rotation. At this juncture, the first output shaft 24 may be rotated to the right by a large amount, and the second output shaft 22 may be rotated to the left by a small amount, thereby moving the hand 14 from the retracted position to the extended position while keeping this hand 14 parallel to the hand 32. During this movement from the retracted position to the extended position, the hand 14 moves while remaining parallel to the center line CL. Similarly, when the hand 32 is to be moved, the hand 32 moves from the retracted position to the extended position while remaining parallel to the hand 14 by rotating the first output shaft 24 and the second output shaft 22 in differing directions and by differing amounts of rotation.

In the robot arm 100, the material of the parallel links 4 and 20 is selected to be a material having a smaller thermal expansion coefficient than the material of the first upper arm link 18, the first lower arm link 10, the second upper arm link 2, and the second lower arm link 28. As described earlier, the motor radiates heat more efficiently because it is disposed at the atmosphere side, and consequently links close to the motor are more unlikely to experience severe rise in temperature, whereas links far from the motor are prone to greater rise in temperature. Considering the heat transfer path of the robot arm 100 in the case where high temperature work (for example, a semiconductor wafer) is to be held and moved by the hands 14 and 32, the parallel links 4 and 20 do not radiate much heat, and consequently the temperature of these links rises. As a result, the temperature of the parallel links 4 and 20 reaches T2, while the temperature of the other links 18, 10, 2, and 28 reaches T1 (T2>T1). If the material of the parallel links 4 and 20 is the same as the material of the other links 18, 10, 2, and 28, the elongation ratio caused by the thermal expansion for the parallel links 4 and 20 will be different from the elongation ratio of the other links 18, 10, 2, and 28. As a result, the shape of the polygon (pentagon) formed by the closed link mechanism differs between prior to the thermal expansion of the links and after the thermal expansion of the links.

In the robot arm 100, the material of the parallel links 4 and 20 is selected such that their elongation ratio when the temperature of the parallel links 4 and 20 changes from T0 (room temperature) to T2 approximately equals to the elongation ratio of the other links 18, 10, 2, and 28 when their temperature changes from T0 to T1. By selecting the material of the parallel links 4 and 20 in this manner, the polygon of the closed link mechanism may change its size while maintaining approximately the same shape that is proportionate between prior to operation of the robot arm 100 (room temperature) and during operation of the robot arm 100 (the links being in a thermally expanded state due to moving the high temperature wafer). Although the position of the hand 14 becomes misaligned from the position prior to operation (room temperature) due to thermal expansion, a difference between the magnitude of misalignment of the hand 14 in the retracted position (see FIG. 1) and the magnitude of misalignment of the hand 14 in the extended position (see FIG. 2) can be reduced between prior to and during operation. This is also the case for the hand 32.

Moreover, as an example of a combination of materials having differing thermal expansion coefficients, the parallel links 4 and 20 may be made e.g. from stainless steel (e.g., SUS 304), and the other links 18, 10, 2, and 28 may be made from aluminum (e.g., A5052).

The reason will now be described as to why it is possible to reduce the difference between the magnitudes of misalignment of the hand 14 in the retracted position and in the extended position by having the shape of the closed link mechanism remain homothetic between prior to operation of the robot arm 100 (room temperature) and during operation of the robot arm 100 (when thermal expansion of the links has occurred).

As described above, during the operation of the robot arm 100, the temperature of the parallel links 4 and 20 rises from T0 to T2. The temperature of the other links 18, 10, 2, and 28, however, rises only from T0 to T1 (T1<T2).

Figure 3:
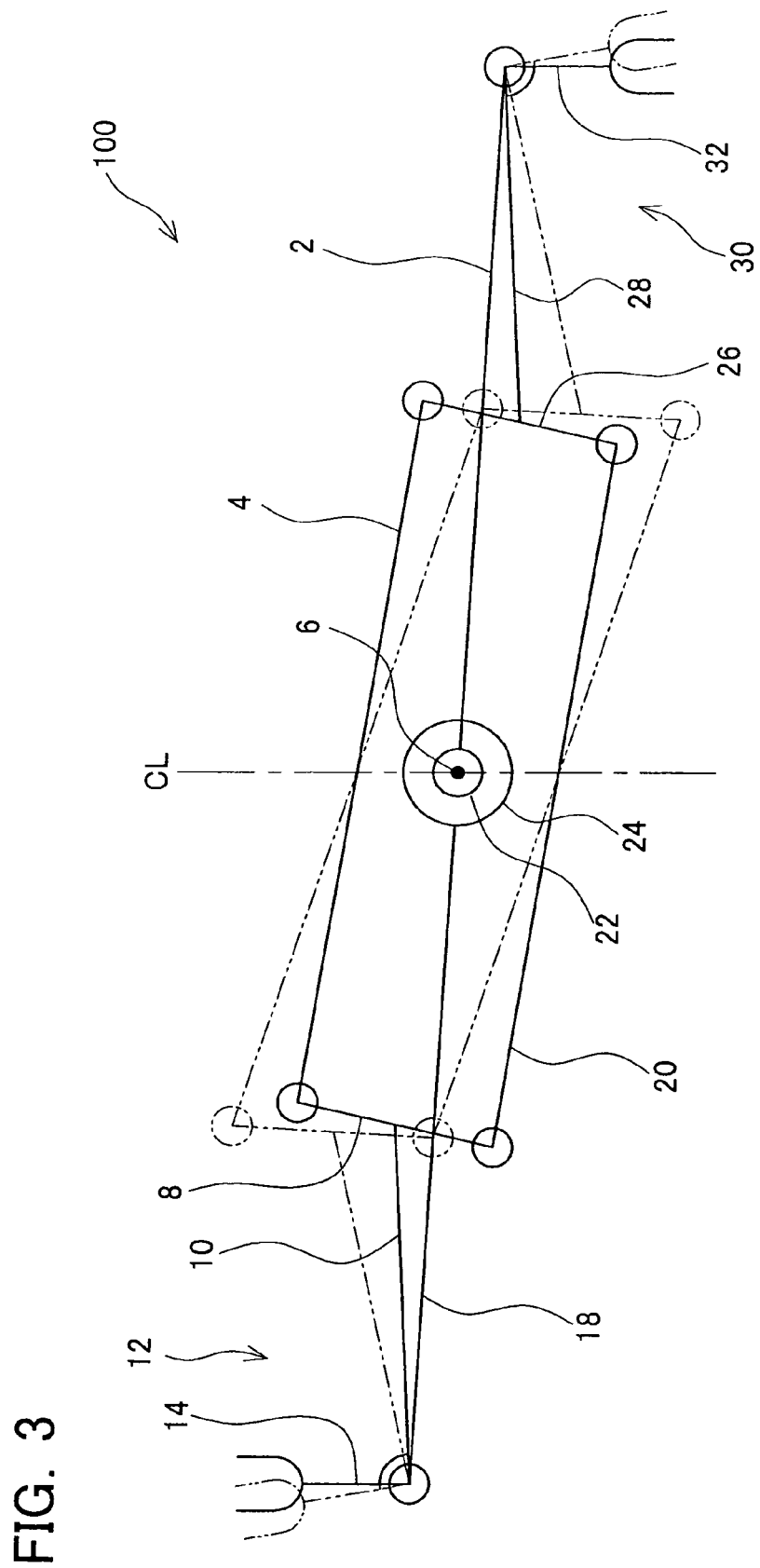
FIG. 3 shows misalignment when the hand of the robot arm of the first embodiment is in the retracted position.
Figure 4:
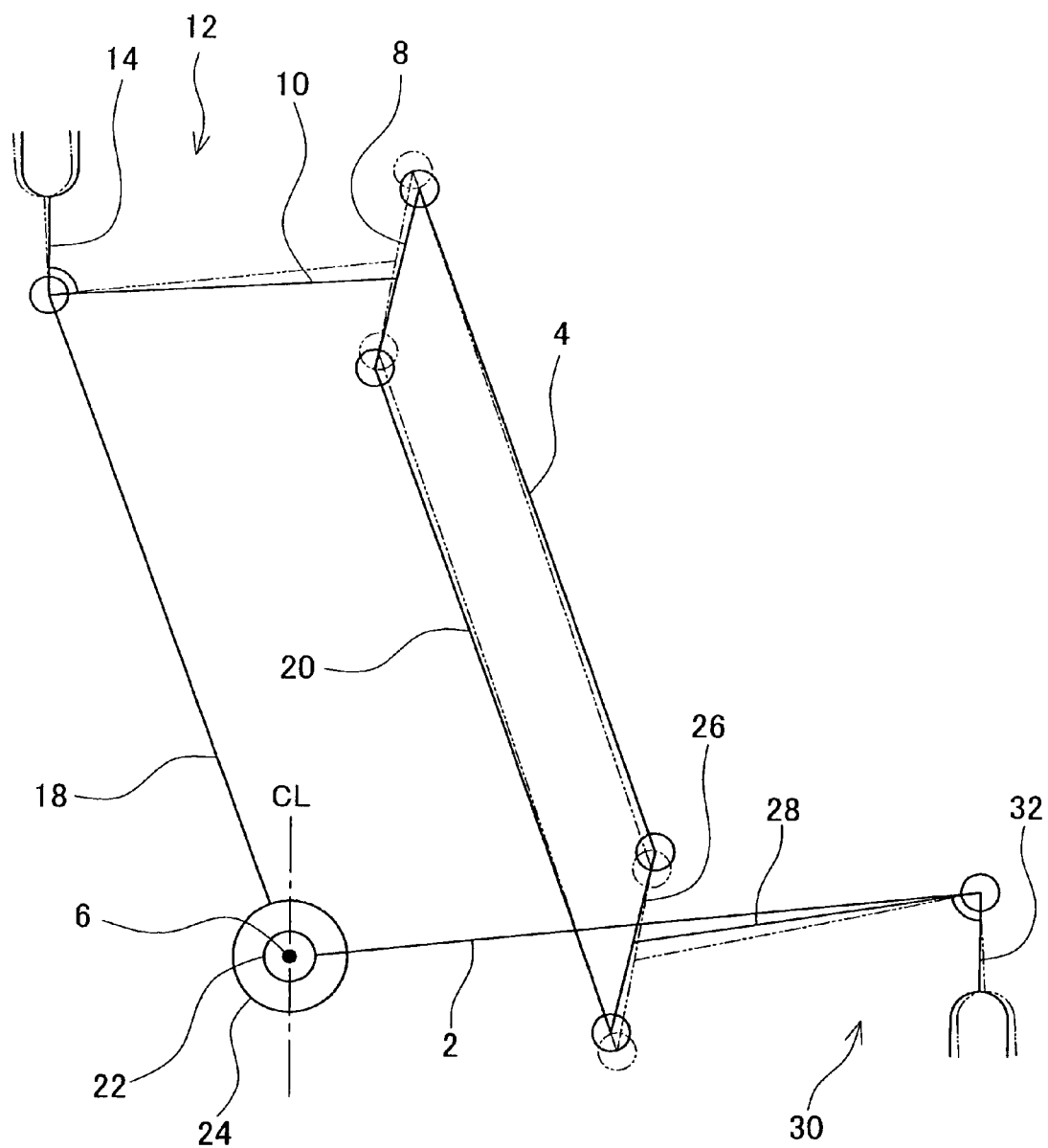
FIG. 4 shows misalignment when the hand of the robot arm of the first embodiment is in the extended position.

FIG. 3 and FIG. 4 show the robot arm 100 in which the elongation ratio of the parallel links 4 and 20 when their temperature changes from T0 (the pre-operation temperature) to T2 is equal to the elongation ratio of the other links 18, 10, 2, and 28 when their temperature changes from T0 to T1. Virtual lines in the figures (two-dot chain lines) show the robot arm 100 when the material of the parallel links 4 and 20 is identical to that of the other links 18, 10, 2, and 28. In this case, the elongation ratio of the parallel links 4 and 20 when their temperature has changed from T0 to T2 is greater than the elongation ratio of the other links 18, 10, 2, and 28 when their temperature has changed from T0 to T1.

As shown in FIG. 3 and FIG. 4, in the case where the elongation ratio of the parallel links 4 and 20 is equal to the elongation ratio of the other links 18, 10, 2, and 28, the shape formed by the closed link mechanism maintains the shape analogous to prior to the thermal expansion of the links (prior to operation of the robot arm 100) (see also FIG. 1 and FIG. 2). However, when the elongation ratio of the parallel links 4 and 20 is greater than the elongation ratio of the other links 18, 10, 2, and 28, the shape formed by the closed link mechanism differs (becomes misaligned) from the shape prior to the operation of the robot arm 100.

In the case where the polygon formed by the closed link mechanism during the operation of the robot arm 100 is to be kept homothetic to the polygon formed by the closed link mechanism prior to the operation, the position of the hand 14 during the operation becomes misaligned in a parallel manner from the position of the hand 14 prior to operation. On the other hand, in the case where the polygon formed by the closed link mechanism is not to be kept homothetic, the position of the hand 14 during the operation becomes no longer parallel to the position of the hand 14 prior to the operation. The misalignment between the angle of the hand 14 prior to the operation and the hand 14 during the operation changes depending on the shape of the pentagon formed by the closed link mechanism. This is clear from comparing FIG. 3 and FIG. 4.

As is clear from FIG. 3 and FIG. 4, in the case where the polygon formed by the closed link mechanism does not keep similar shape prior to the operation and during the operation of the robot arm 100, the effect on the position of the hand 14 caused by the misalignment in the shape of the polygon formed by the closed link mechanism in the retracted position, and the effect on the position of the hand 14 caused by the misalignment in the shape of the polygon formed by the closed link mechanism in the extended position have a large difference. As a result, the magnitude of the misalignment of the hand 14 becomes great in between the retracted position and the extended position.

In contrast, in the case where the polygon formed by the closed link mechanism remains similar prior to operation and during operation, the position of the hand 14 becomes misaligned only in the parallel manner. Since the shape of the polygon does not deform (no interior angles of the polygon change), the misalignment of the hand 14 in the retracted position and in the extended position causes only a misalignment in the size of the polygon whose shape has changed in a similar manner. As a result, the magnitude of misalignment of the hand 14 is maintained small in the two positions. This also applies to the hand 32.

In the robot arm 100, an example has been described where the material of the parallel links 4 and 20 has a smaller thermal expansion coefficient than the material of the other links 18, 10, 2, and 28. However, the case is also possible where the temperature of the parallel link 4 and the parallel link 20, and of the first lower arm link 10 and the second lower arm link 28 becomes greater than the temperature of the first upper arm link 18 and the second upper arm link 2 due to the operating environment or dimensions, etc. of the robot arm 100. In this case, the material of the parallel link 4 and the parallel link 20, as well as the first lower arm link 10 and the second lower arm link 28 may be selected to have the thermal expansion coefficient smaller than that of the material of the first upper arm link 18 and the second upper arm link 2.

(Second Embodiment)

A robot arm 200 will be described with reference to FIG. 5 and FIG. 6.

The robot arm 200 is a variant of the robot arm 100, and components that are essentially the same as those of the robot arm 100 will have the same two lower digits appended thereto, and a description thereof may be omitted.

Figure 5:
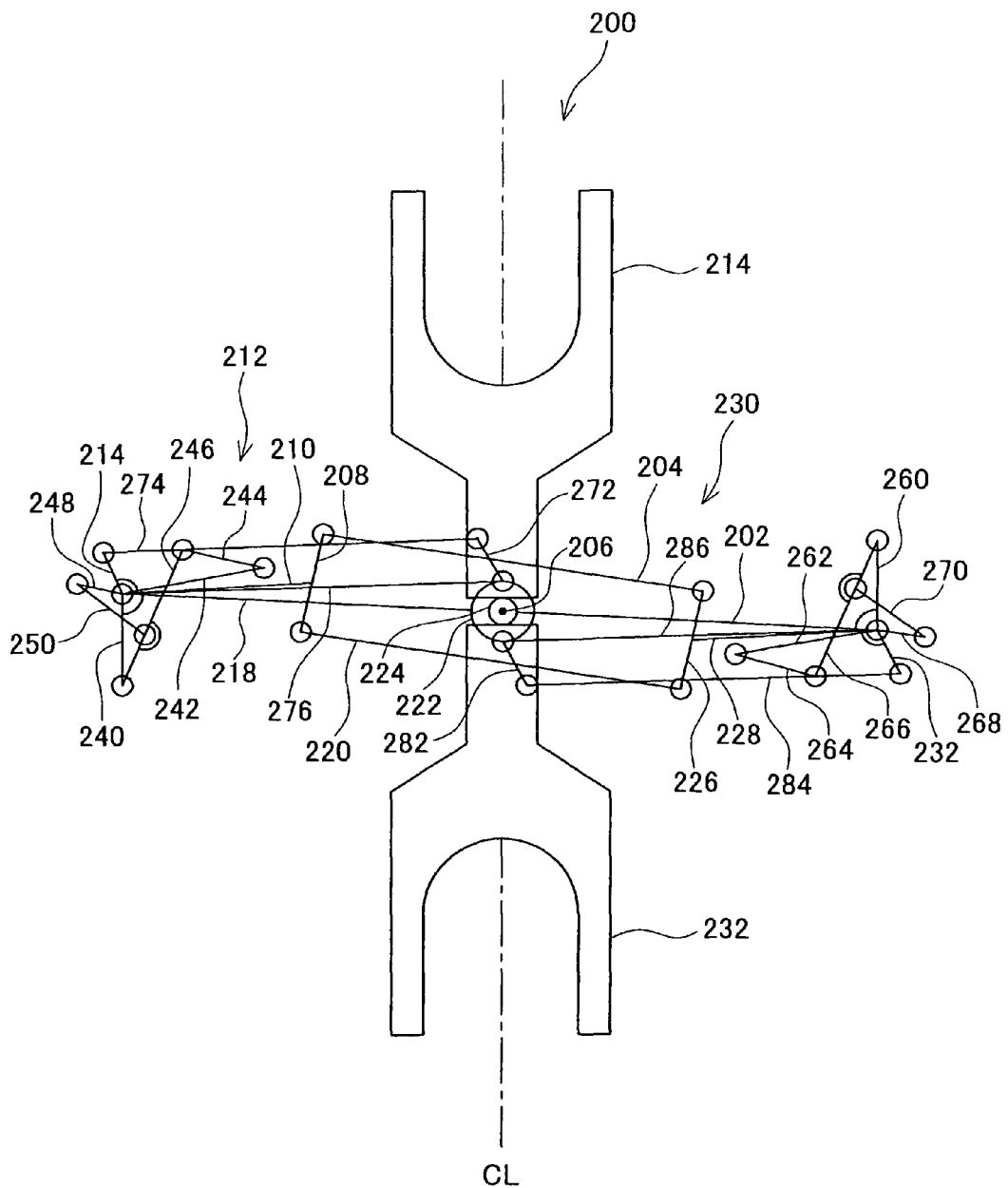

FIG. 5 shows the robot arm 200 when a hand 214 and a hand 232 are in the retracted position. FIG. 6 shows the robot arm 200 when the hand 214 is in the extended position.

The robot arm 200 comprises a first arm 212 and a second arm 230. The first arm 212 comprises a first upper arm link 218, a first lower arm link 210, and a first end link 276. The second arm 230 comprises a second upper arm link 202, a second lower arm link 228, and a second end link 286.

An extension member 242 is fixed to a distal end of the first upper arm link 218. An extension member 213 and an extension member 240 are fixed to one end (a proximal end) of the first lower arm link 210. One end (a proximal end) of the first end link 276 is connected to the distal end (the "other end" with respect to the "one end") of the first upper arm link 218 and to the proximal end of the first lower arm link 210. An extension member 248 is fixed to the aforesaid one end of the first end link 276. One end of a link 244 is connected to the extension member 242, and one end of a link 246 is connected to another end of the link 244. Another end of the link 246 is connected to the extension member 240. One end of a link 250 is connected to the extension member 248, and another end of the link 250 is connected to an intermediate portion of the link 246. Moreover, the extension member 240, the link 244, and the link 250 have the same length, and the extension member 242 and the link 246 have the same length.

One end of a link 272 is connected to another end (distal end) of the first end link 276, one end of a link 274 is connected to another end of the link 272, and another end of the link 274 is connected to the extension member 213. The extension member 213 and the link 272 have the same length, and are disposed parallel to one another. The link 276 and the link 274 have the same length, and are disposed parallel to one another.

In the robot arm 200, the hand 214 moves along the center line CL when the relative angle of the first upper arm link 218 and the second upper arm link 202 is changed by the connecting structure configured by the extension members 213, 248, 240, 242, the links 250, 244, and 246. Similarly, the robot arm 200 can move the hand 232 along the center line CL.

Figure 6:
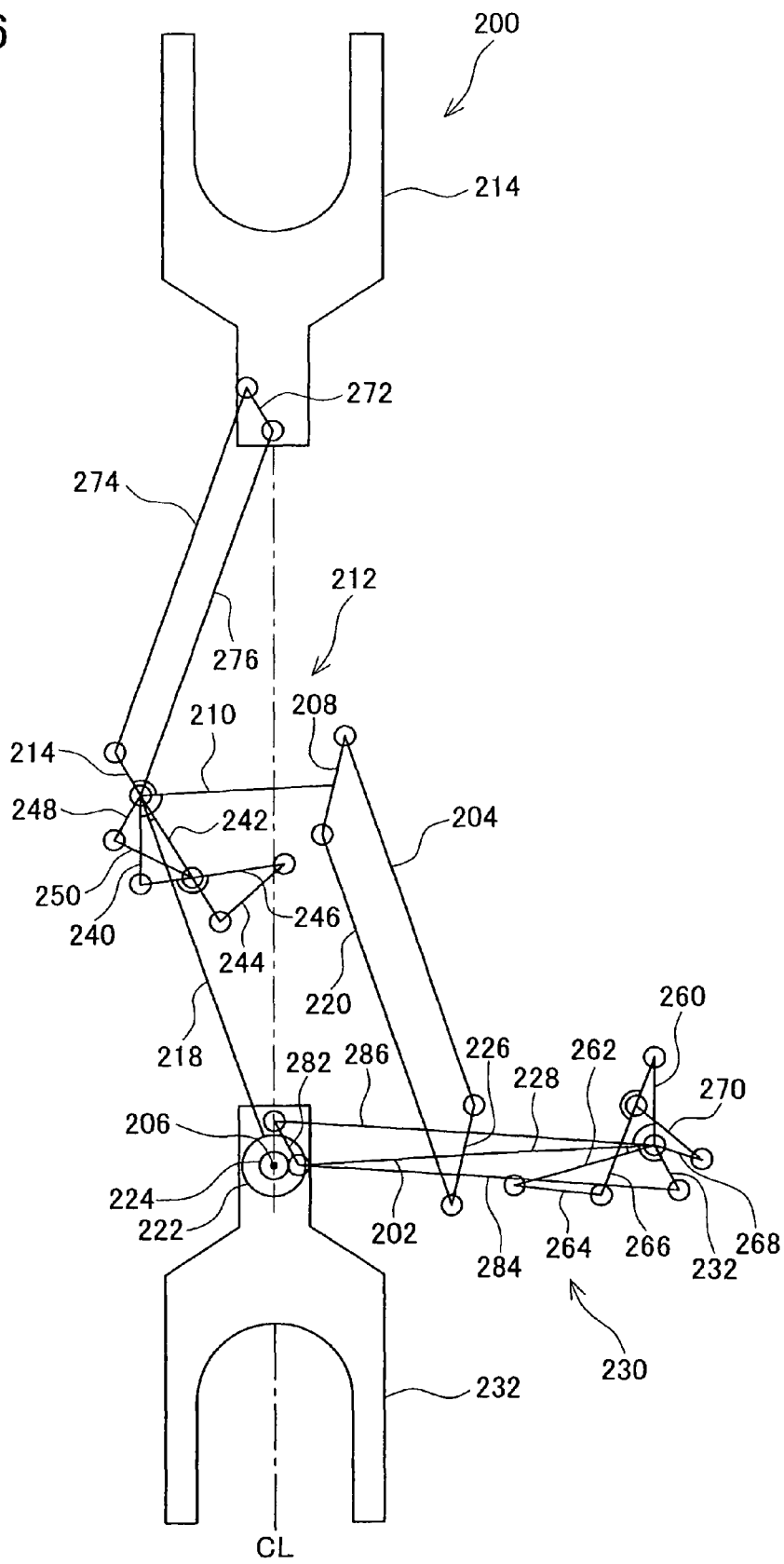
FIG. 6 shows a state in which the hand of the robot arm of the second embodiment is in the extended position.

The robot arm 200 is a type of scalar robot arm capable of moving the hand 214 or the hand 232 within a flat plane parallel to the plan surfaces as shown of FIG. 5 and FIG. 6.

In the robot arm 200, as well, the material of a parallel link 204 and a parallel link 220 is selected from those having a smaller thermal expansion coefficient than the material of the other links. That is, the material of the parallel link 204 and the parallel link 220 is selected such that their elongation ratio when the temperature of the parallel link 204 and the parallel link 220 rises from T0 (the pre-operation temperature of the robot arm 200) to T2 (the temperature during operation) is approximately identical to the elongation ratio when the temperature of the other links raises from T0 to T1 (T1≠T2).

In the robot arm 200, at the retracted position of FIG. 5, the hand 214, the parallel link 204 and the first upper arm link 218 are disposed in an overlapping manner, and the hand 232, the parallel link 220 and the second upper arm link 202 are disposed in the overlapping manner in the aforesaid respective sequence. In the case where high temperature work is held and moved by the hands 214 and 232, the hands 214 and 232 having a high temperature are positioned immediately above the parallel links 204 and 220. In addition to the effect from the heat transfer path, the parallel links 204 and 220 are also effected by the heat from the hands 214 and 232, and consequently it becomes more difficult for the parallel links 204 and 220 to radiate heat, and the temperature of these links rises thereby.

Moreover, the effects that can be obtained by having the elongation ratio of the parallel link 204 and the parallel link 220 when their temperature changes from T0 to T2 being approximately the same as the elongation ratio of the other links when their temperature changes from T0 to T1 are essentially the same as with the robot arm 100, and consequently a detailed description thereof is omitted.

In the robot arm 200, if the elongation ratios of the parallel link 204 and the parallel link 220 when their temperature changes from T0 to T2 differ from the elongation ratios of the other links when their temperature changes from T0 to T1, the magnitude of the misalignment of the extension member 213 and the extension member 240 in the retracted position becomes greatly different from the magnitude of the misalignment of the extension member 213 and the extension member 240 in the extended position. As a result, the magnitude of the misalignment of the hand 214 in the retracted position becomes greatly different from the magnitude of the misalignment of the hand 214 in the extended position.

The configuration of the second arm 230 is essentially the same as that of the first arm 212. The reference numbers for the second arm 230 that correspond to the configuration of the first arm 212 are given below, and a detailed description thereof may be omitted.

The extension member 242 corresponds to an extension member 262, the extension member 213 corresponds to an extension member 231, the extension member 240 corresponds to an extension member 260, and the extension member 248 corresponds to an extension member 268. The first end link 276 corresponds to the second end link 286. The link 244 corresponds to a link 264, the link 246 corresponds to a link 266, the link 250 corresponds to a link 270, the link 272 corresponds to a link 282, and the link 274 corresponds to a link 284.

(Third Embodiment)

Figure 7:
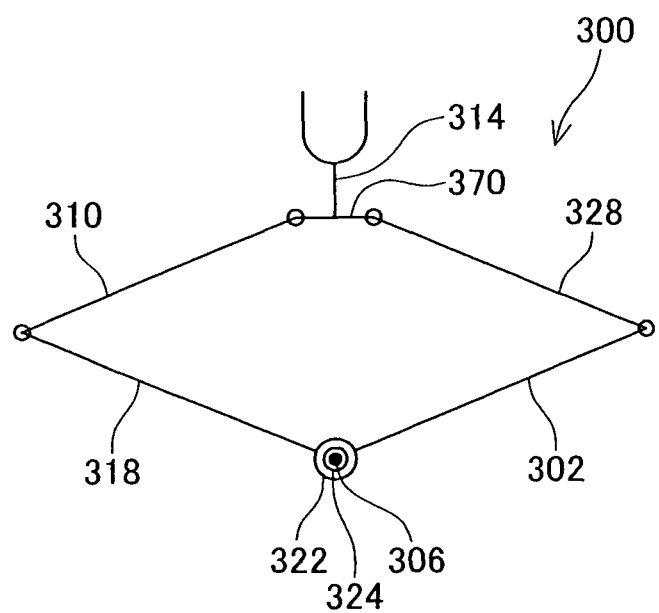
FIG. 7 shows a robot arm of a third embodiment.

A robot arm 300 will be described with reference to FIG. 7.

The robot arm 300 comprises a first upper arm link 318 having one (proximal) end connected to an output shaft 324 of a first motor, a second upper arm link 302 having one (proximal) end connected to an output shaft 322 of a second motor, a first lower arm link 310 having one (proximal) end connected to another (distal) end of the first upper arm link 318, a second lower arm link 328 having one (proximal) end connected to another (distal) end of the second upper arm link 302, and an end link 370 connected to another (distal) end of the first lower arm link 310 and to another (distal) end of the second lower arm link 328. A hand 314 is connected to the end link 370.

In the robot arm 300, a closed link structure is formed by the first upper arm link 318, the first lower arm link 310, the end link 370, the second lower arm link 328, and the second upper arm link 302.

In the robot arm 300, as well, in the case where, when high temperature work is transported, the temperature of one or a plurality of links (which may be called first predetermined link(s)) from among the links 318, 310, 370, 328, and 302 is to change from T0 to T1 and the temperature of one or a plurality of links (which may be called second predetermined link(s)) from among the links 318, 310, 370, 328, and 302 is to change from T0 to T2 (T1≠T2), the material of the first predetermined link(s) and the material of the second predetermined link(s) are made to differ. That is, the materials of the links are selected such that the elongation ratio of the first predetermined link(s) when its/their temperature changes from T0 to T1 is approximately equal to the elongation ratio of the second predetermined link(s) when its/their temperature changes from T0 to T2.

In the robot arm 300, when high temperature work is transported, the shape formed by the closed link changes but in homothetic shape. It is possible to reduce the difference in a magnitude of misalignment of the hand 314 in the retracted position and the magnitude of misalignment of the hand 314 in the extended position.

Specific embodiments of the present invention are described above, but these merely illustrate some possibilities of the invention and do not restrict the claims thereof. The art set forth in the claims includes variations and modifications of the specific examples set forth above.

For example, in the first embodiment, the hand is fixed to the one, proximal end of the lower arm link. However, the hand may be fixed to an intermediate portion of the lower arm link.

In the second embodiment, the two hands move along the same center line. However, the two hands may be made to move along differing axis lines by adjusting the length of the anterior end link.

The technical elements disclosed in the specification or the drawings have technical utility separately or in all types of combinations, and are not limited to the combinations set forth in the claims at the time of filing of the application. Furthermore, the art disclosed in the specification or the drawings may be utilized to simultaneously achieve a plurality of aims, and has technical utility by achieving any one of these aims.

The invention claimed is:

1. A robot arm comprising:
a closed link mechanism that forms a polygon arranged between a base and a first hand, and including a plurality of links, wherein
the plurality of links include a first predetermined link that, during an operation, reaches a first average temperature T1, and a second predetermined link that, during the operation, reaches a second average temperature T2,
a material of the first predetermined link is different from a material of the second predetermined link member, and
an elongation ratio of the first predetermined link, in which a length of the first predetermined link at the first average temperature T1 is divided by a length of the first predetermined link at a pre-operation temperature T0, is approximately equal to an elongation ratio of the second predetermined link, in which a length of the second predetermined link at the second average temperature T2 is divided by a length of the second predetermined link at the pre-operation temperature T0.

2. The robot arm according to claim 1, further comprising:
a first motor attached to the base;
a second motor attached to the base; and
a first hand, wherein the first predetermined link comprises:
a first upper arm having one end connected to an output shaft of the first motor;
a second upper arm having one end connected to an output shaft of the second motor;
a first lower arm having one end connected to another end of the first upper arm; and
a second lower arm having one end connected to another end of the second upper arm, and
the second predetermined link comprises:
a parallel link connecting another end of the first lower arm and another end of the second lower arm and keeping the first lower arm and the second lower arm parallel, and
wherein the first lower arm is connected to the first hand.

3. The robot arm according to claim 1, wherein
the robot arm is utilized in a circumstance that the first predetermined link is located within a high temperature zone and the second predetermined link is within a low temperature zone.

4. The robot arm according to claim 1, wherein
the first average temperature T1 is lower than the second average temperature T2, and
a thermal expansion coefficient of the material of the first predetermined link is larger than a thermal expansion coefficient of the material of the second predetermined link.

5. The robot arm according to claim 4, wherein
the material of the first predetermined link is aluminum, and the material of the second predetermined link is stainless steel.

6. The robot arm according to claim 2, wherein
the first upper arm and the output shaft of the first motor are pivotally connected,
the second upper arm and the output shaft of the second motor are pivotally connected,
the first lower arm and the first upper arm are pivotally connected,
the second lower arm and the second upper arm are pivotally connected, and
the parallel link and the first lower arm are fixedly connected,
the parallel link and the second lower arm are fixedly connected, and
the first lower arm and the first hand are fixedly connected.

7. The robot arm according to claim 2, wherein
when seen from a view perpendicular to a direction in which the first hand is moved from a retracted position to an extended position, the first hand, the parallel link, and the first upper arm are disposed so as to overlap each other in this sequence when the first hand is positioned in the retracted position.

8. The robot arm according to claim 2, wherein
the robot arm is utilized in a circumstance that the first predetermined link is located within a high temperature zone and the second predetermined link is within a low temperature zone.

9. The robot arm according to claim 2, further comprising:
a second hand connected to the second lower arm of the closed mechanism.

10. The robot arm according to claim 9, wherein
the first hand and the second hand are configured to move in opposing directions.

11. The robot arm according to claim 2, wherein
the first predetermined link comprises the first upper arm and the second upper arm, and the second predetermined link comprises the parallel link.

12. The robot arm according to claim 11, wherein
the second predetermined link further comprises the first lower arm and the second lower arm.

13. The robot arm according to claim 2, wherein the first average temperature T1 is lower than the second average temperature T2, and
a thermal expansion coefficient of the material of the first predetermined link is larger than a thermal expansion coefficient of the material of the second predetermined link.

14. The robot arm according to claim 13, wherein
the material of the first predetermined link is aluminum, and the material of the second predetermined link is stainless steel.

* * * * *